United States Patent [19]

Warren, Jr. et al.

[11] Patent Number: 4,710,401

[45] Date of Patent: Dec. 1, 1987

[54] METHOD OF PRINTING ELECTRICALLY CONDUCTIVE IMAGES ON DIELECTRIC SUBSTRATES

[75] Inventors: Leslie F. Warren, Jr.; Louis Maus, both of Camarillo; William F. Hall, Thousand Oaks, all of Calif.

[73] Assignee: Rockwell International Corporation, El Segundo, Calif.

[21] Appl. No.: 12,460

[22] Filed: Feb. 9, 1987

Related U.S. Application Data

[63] Continuation-in-part of Ser. No. 883,260, Jul. 8, 1986, and Ser. No. 916,917, Oct. 9, 1986.

[51] Int. Cl.$^4$ .................. B05D 5/12; B05D 5/00; C23C 16/00
[52] U.S. Cl. .................... 427/121; 252/500; 427/255.6; 427/287; 427/288; 427/341; 427/342; 528/423
[58] Field of Search ............. 252/500; 427/121, 255.6, 427/299, 322, 385.5, 389.8, 389.9, 287, 288, 341, 342; 528/423

[56] References Cited

U.S. PATENT DOCUMENTS

| | | | |
|---|---|---|---|
| 4,487,667 | 12/1984 | Traynor | 528/423 X |
| 4,521,450 | 6/1985 | Bjorklund et al. | 427/255.6 X |
| 4,567,250 | 1/1986 | Naarmann et al. | 252/518 X |
| 4,585,695 | 4/1986 | Ogasawara et al. | 252/500 X |

*Primary Examiner*—Michael R. Lusignan
*Attorney, Agent, or Firm*—Charles T. Silberberg; Max Geldin

[57] ABSTRACT

A process for generating electrically conductive patterns on a dielectric substrate, such as an insulating sheet, which comprises applying to preselected areas of the substrate a preselected concentration of an ink in the form of an oxidizing agent, such as a solution of a ferric salt, e.g., ferric chloride or ferric ethylbenzenesulfonate, and which can also contain a suitable binder or thickening agent, to form printed images on the substrate surface. The resulting printed surface of the substrate is then exposed to an excess of reactant, e.g., pyrrole monomer in vapor phase, which reacts with the oxidizing agent to develop conductive images, as by forming polypyrrole, in those printed areas of the substrate containing the oxidizing agent.

25 Claims, 1 Drawing Figure

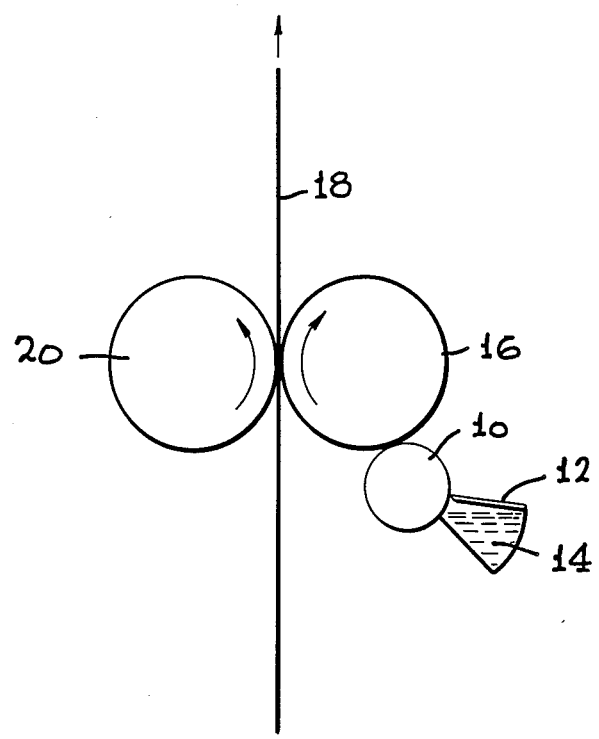

METHOD OF PRINTING ELECTRICALLY CONDUCTIVE IMAGES ON DIELECTRIC SUBSTRATES

BACKGROUND OF THE INVENTION

This application is a continuation-in-part of copending U.S. application Ser. No. 883,260, filed July 8, 1986, and copending U.S. application Ser. No. 916,917, filed Oct. 9, 1986.

This invention relates to a process for printing electrically conductive images on dielectric or insulating surfaces and is particularly directed to a process for generating electrically conductive patterns on preselected areas of a dielectric substrate, at controlled sheet resistance for electromagnetic energy control.

Electromagnetic radiation at specific frequencies can be controlled using thin plastic (dielectric) sheets onto which geometrical patterns of semiconductive coatings have been deposited. These function because the sheet electrical properties (resistance, inductance and capacitance) are a function of the combined geometry and coating resistivity. Printing with a slightly conductive ink to form such conductive coatings is the presently preferred art, which suffers from the serious limitation that consistent conductivity is not possible to achieve because the conductive agent commonly employed in the ink, namely, dispersed carbon particles, changes its state of agglomeration over time to yield coatings of differing specific resistivity for inks that have been stored for different times before printing.

Further, the use of carbon particles in the ink is difficult to work with. Thus, when employing such a system, in order to deposit the ink so as to obtain sufficient carbon particles in the deposited ink to be conductive, while the ink still has sufficient adhesion to adhere to the substrate, the ink must be deposited on the substrate in large amounts. This severely limits the versatility of the process for obtaining printed conductive images of selectively varying conductivity.

An object of the present invention is the provision of a process for printing images of controlled electrical conductivity on a dielectric substrate.

Another object is to provide a facile process for generating patterns of electrically conductive images having a controlled sheet resistance on a sheet of insulating or dielectric material.

SUMMARY OF THE INVENTION

The above objects are achieved according to the invention by employing the concept that certain conductive polymers, particularly polypyrrole, can be synthesized in a single step by a direct reaction of the pyrrole monomer with an oxidizing agent, such as ferric chloride or ferric ethylbenzenesulfonate, as disclosed in the above copending applications. Such oxidizing agent is effectively consumed in the polymerizing reaction in direct proportion to the amount of polymer produced. Thus, the conductivity achieved in a given specimen of a matrix material, such as an insulating sheet, will be determined by the amount of accessible oxidizing agent deposited in that specimen, provided the material is exposed to and reacts with an excess of the monomeric reactant.

The oxidizer functioning as the ink in the present process is deposited in preselected concentrations and in certain preselected areas on the substrate surface. This provides a printed ink surface of a pattern, e.g., of geometric figures. An electrically conductive pattern is generated from the printed ink pattern by subjecting the substrate containing the printed figures to treatment with pyrrole monomer, in vapor or liquid form, to develop the images only in those areas of the printed surface where the oxidizer or ink is deposited.

In the case of pyrrole and its substituted derivatives (e.g., N-methylpyrrole), a solution of a suitable oxidizing agent, such as salts of $Fe^{3+}$, $Ce^{4+}$, $NO^+$, $NO_2^+$, and $(C_6H_5)_3C^+$, can be employed as a printing ink to create images of precise geometry containing a preselected concentration of the oxidizing agent. The solution may also contain elutable binders or other thickening agents.

Applying the invention principles to the flexigraphic printing process, printing ink levels on a feed roller are maintained constant, as by scraping excess ink off, and the ink on the feed roller is then picked up by a printer roller on the high parts thereof forming the pattern, and the ink pattern on the printed roller is transferred to the substrate sheet or web to form a predetermined corresponding pattern thereon. The key feature according to the present invention is the use of the ink itself, and such flexigraphic process can use an aqueous based or organic solvent based ink incorporating the oxidant, e.g., ferric oxidants, at this stage.

The invention process is equally applicable to screen printing, which develops very thick image layers, and also to lithography wherein the oxidant is applied in a pattern.

The resulting printed surface of the substrate is then exposed to an excess of the monomeric reactant, e.g., pyrrole monomer, preferably in vapor phase, to develop the electrically conductive images on the surface of the substrate. A washing step can be employed to remove undesirable by-products of the polymerization reaction.

As a process control, a measurement step can be inserted after printing to verify the concentration of oxidizer in the images so as to obtain the proper electrical conductivity and permit correction before development. Should higher conductivity of the deposit be required, the oxidizer/pyrrole process can be repeated until the desired level of conductivity is achieved.

The invention process is readily carried out and results in the generation of electrical patterns in a dielectric substrate having controlled sheet resistance for electromagnetic energy control.

DESCRIPTION OF THE DRAWING

The drawing illustrates the flexigraphic printing process, employing an ink according to the invention.

DETAILED DESCRIPTION OF THE INVENTION AND PREFERRED EMBODIMENTS

According to a preferred embodiment of the invention, the ink comprising an aqueous or organic solvent solution of a suitable oxidant or oxidizing agent, such as $Fe^{3+}$ and including a non-nucleophilic anion, such as $Cl^-$ or sulfonate, derived, e.g., from ferric chloride or ferric ethylbenzenesulfonate, is applied to a printer roller containing a pattern which is to be applied to a substrate sheet, such as a plastic sheet, e.g., Mylar. The ink on the high parts of the printing roller, forming the pattern, is then transferred to the substrate sheet.

After drying, the substrate sheet containing the ink or oxidant material, e.g., ferric chloride or ferric ethylbenzenesulfonate, in preselected areas of the sheet, and forming a printed pattern thereon, is suspended above the surface of a liquid pyrrole or pyrrole solution, or a mixture of pyrrole, and a substituted derivative thereof, such as an N-substituted pyrrole, generating pyrrole vapor, which contacts the printed ink pattern. Alternatively, if desired, the substrate sheet containing the printed ink pattern can be contacted with liquid pyrrole or pyrrole solution, as by brushing such liquid pyrrole or pyrrole solution over the printed pattern on the substrate. This results in the oxidation of the pyrrole material and the chemical deposition of a polypyrrole, or a copolymer of pyrrole and a substituted derivative thereof, in the printed areas of the sheet, to develop the conductive images in such areas. The developed images are comprised of a dark layer or film of conductive polypyrrole which forms in a period of minutes in those areas of the substrate forming the pattern.

The electrically conductive polymer thus deposited as a layer or film on the printed preselected portion of the substrate comprises a cationic polypyrrole portion and an anionic portion derived from the non-nucleophilic anion, e.g., chloride or sulfonate.

Optionally, a washing step for removal of undesired by-products of the pyrrole polymerization reaction can be carried out, as by application of an aqueous spray on the conductive images of the substrate, or by immersing the substrate in water or other suitable wash.

As a process control, a suitable measurement step may be carried out after printing with the oxidizing agent and prior to exposure of the printed substrate to the pyrrole vapors, to verify the concentration of oxidizer in the printed images and permit correction prior to development with pyrrole vapors.

In carrying out the invention process, porous or non-porous dielectrics or electrically insulating substrates can be used, such as ceramic, a porous or non-porous glass, e.g., a frit, a porous or non-porous reticulated organic foam, e.g., polyurethane, a fiberglass fabric, a mixed oxide fabric, such as an alumina/silica/boria fabric, e.g., Nextel, or a synthetic organic fabric, such as Kevlar, a trademark of the DuPont Company for aromatic polyamide fiber, a polyester, such as Dacron cloth or Mylar, a polyimide, such as Kapton, or a nylon-based material, such as Wrightlon, or paper. The insulating substrate material can vary in thickness. An insulating substrate, such as Mylar, can have a thickness, e.g., ranging from about 1 to about 20 mils. The substrate can be in the form of individual sheets or can be supplied from a roll for continuous feeding in contact with a printer roller.

The printing process and ink systems of the invention can be applied to so-called "flexigraphic printing" but is not limited thereto. Using such procedure, the oxidant solution is applied first to the periphery of a feed roller or metering roller using a means, such as a knife blade, to maintain the ink levels on the roller constant. The ink on the feed roller is then transferred to the raised parts of a printer roller, forming the pattern, and the ink from such pattern is then transferred to the dielectric substrate or sheet by passing the sheet into contact with the printer roller and forming the desired printed ink pattern on the substrate sheet corresponding to the pattern on the printer roller. The oxidants forming the chief constituent of the printing ink can include the cations $Fe^{3+}$, $Cu^{2+}$, $Ce^{4+}$, $NO^+$, $NO_2^+$ and $(C_6H_5)_3C^+$, $Fe^{3+}$ being preferred. Examples of compounds providing the above cations as oxidizing agents are the soluble salts of the above cations, such as ferric perchlorate, ferric chloride, cupric fluoborate, cupric perchlorate, nitrosyl hexafluorophosphate, triphenylmethyl fluoborate, ceric sulfate, and the like.

The term "oxidant" as employed herein is intended to denote any oxidizing substance which is capable of oxidizing pyrrole or a substituted derivative thereof as defined in greater detail hereinafter, to produce polypyrrole or a pyrrole copolymer.

A material providing substantially non-nucleophilic anions functioning as dopant for the pyrrole polymer is also employed, preferably in conjunction with the oxidant. These anions are generally strong acid anions, such as sulfate, bisulfate, sulfonate, perchlorate, fluoborate $PF_6^-$, $AsF_6^-$ and $SbF_6^-$ anions. Chloride anion also can be used, even though it is somewhat nucleophilic.

Although the oxidant as cation and the non-nucleophilic anion can be provided by separate compounds, a convenient manner for providing both the strong oxidant and non-nucleophilic anion is in the form of a salt incorporating both the oxidant cation and the non-nucleophilic anion, as exemplified by the compounds ferric perchlorate, ferric chloride, cupric fluoborate, cupric perchlorate, and the nitrosyl and triphenylmethyl salts, e.g., nitrosyl hexafluorophosphate ($NOPF_6$), and also alkyl and aryl sulfonates, particularly ferric ethylbenzenesulfonate and ferric dodecylbenzenesulfonate, and mixtures thereof. When ferric chloride is used, the non-nucleophilic anions present include $FeCl_4^-$ and $FeCl_4^{2-}$, as well as chloride ion.

The oxidant employed as ink, and which preferably also incorporates the non-nucleophilic anion, e.g., as in ferric chloride, can be dissolved in water to form an aqueous solution, or such oxidant can be dissolved in an organic solvent, dependent on its ability to dissolve the particular oxidant salt and its inertness with respect to such oxidant salt.

Examples of suitable solvents include alcohols, such as n-butanol, nitriles, such as benzonitrile, ketones, such as methyl ethyl ketone, and ethers, such as butyl ether. Thus, for example, the above-noted ferric salts can be dissolved in n-butanol or methyl ethyl ketone.

The concentration of oxidant material or cation in aqueous or solvent solution can range from about 0.001 to about 2 molar, preferably about 0.5 molar, and the concentration of non-nucleophilic anion or anion producing material also can range from about 0.001 to about 2 molar, preferably about 0.5 molar.

Ferric "ink" systems which are particularly employed in the invention process, e.g., as applied to flexigraphic printing, are based on organic soluble ferric sulfonate salts, e.g., the dodecylbenzenesulfonate or the ethylbenzenesulfonate. Prepared in water from ferric hydroxide and three equivalents of the commercially available sulfonic acids, these materials are readily soluble in most polar organic solvents, e.g., alcohols, acetone, and dichloromethane. While ferric ethylbenzenesulfonate is a solid, the dodecylbenzenesulfonate salt is isolated as a thick, sticky gum with the consistency of hard tar. These materials can be dissolved in a small quantity of organic solvent, e.g., n-butanol or higher alcohols, to the consistency required for a flexigraphic printing ink.

If desired, depending upon the particular oxidant salt employed, the printing solution or ink can also contain suitable binders, thickeners and other agents, such as organic resins, in small amounts of about 0.1%, to about 50% by weight, to improve deposit adhesion and uniformity. Thus, for example, an aqueous ferric chloride solution can be mixed with a dielectric thickener other than carbon, such as silica, employed preferably in fine powder form. A commercially available form of such silica is marketed as Cab-O-Sil by Cabot Corporation. This material has a very high external surface area and is a submicroscopic fire-dry fumed silica. Alternatively, suitable organic polymers, such as a water-soluble polymer can be employed as the thickener, e.g., polystyrenesulfonic acid or quaternary ammonium polymer salts, such as poly (diallyldimethylammonium chloride). Other polymer/resin materials also can be used for this purpose. The binder or thickening agent can be employed in amounts such as to provide the desired consistency to the printing solution for effective application to the dielectric substrate.

The liquid pyrrole solution employed to generate pyrrole vapors for reaction with the oxidant in the printing ink can comprise neat liquid pyrrole, a C-substituted pyrrole, such as a 3- or 3,4- alkyl or aryl-substituted pyrrole, e.g., 3-methylpyrrole, 3,4-dimethylpyrrole, 3-phenylpyrrole or 3-methyl-4-phenylpyrrole, an N-substituted pyrrole, e.g., an N-alkylpyrrole, such as N-methylpyrrole, or an N-arylpyrrole, such as N-phenylpyrrole, or a substituted N-phenylpyrrole, such as nitrophenylpyrrole, to obtain the corresponding conductive pyrrole homopolymer. For production of a conductive copolymer, a mixture of pyrrole and a C- or an N-substituted derivative of pyrrole, as described above, can be employed. The use of N-substituted pyrroles results in lower conductivity polymers than the parent polypyrrole. Hence, the use of pyrrole is preferred for higher conductivity applications.

The pyrrole may or may not contain a solvent. The solvents used can be any organic solvent in which pyrrole is soluble and which does not interfere with the desired oxidation reaction. Such solvents include alcohols, ethers, methylene chloride, benzene and hexane, particularly the latter. The concentration of the pyrrole in the solvent can vary but generally is in the range from about 0.03 to about 2 molar. Usually, the liquid or neat pyrrole is employed without a solvent.

According to one mode of operation, the ink or oxidant solution can be applied to the substrate, e.g., in the form of a sheet, by a conventional roller printing apparatus, and the ink deposit "smoothed", if desired, by mild heating, e.g., at about 60° C. After application or printing of the oxidant solution in the preselected areas of the substrate, the printed substrate is permitted to dry with the oxidant residue coating the substrate. Such drying can take place at ambient temperature or by warming in a vacuum oven.

The substrate containing the dried printed images formed by the oxidant is then suspended in a zone of pyrrole vapors, according to preferred practice, as by suspending or passing such substrate over a container or through a zone above the liquid pyrrole or pyrrole solution to oxidize the pyrrole monomer as it makes contact with the oxidant, e.g., ferric salt, in the printed areas of the substrate, and to develop a black film of conducting pyrrole polymer in the preselected printed areas or pattern of the substrate. Alternatively, treatment of the substrate containing the printed images with a pyrrole can be carried out by contacting such substrate with liquid pyrrole or pyrrole solution.

The treatment of the dielectric substrate with the printing or oxidant solution and the generation of pyrrole vapors for contact with the oxidant-containing substrate to effect development of the printed images is generally carried out in each case at ambient or room temperature. However, such temperature can be higher or lower, for example, the liquid pyrrole or pyrrole solution can be heated at elevated temperature to increase the rate and volume of pyrrole vapors generated. Also, in preferred practice, such treatments are carried out in the presence of oxygen or air, or gaseous $N_2$.

The time of treatment of the substrate in the pyrrole vapors is long enough to permit reaction of the pyrrole vapors with the ink or oxidant, and the polymerization and precipitation of polypyrrole to occur, to develop the printed images and form a conductive polypyrrole coating on the preselected printed areas of the substrate The polypyrrole films are comprised of a pyrrole polymer cation and a substantially non-nucleophilic anion as dopant. Where a porous substrate, such as fiberglass, is employed, the polypyrrole also impregnates the interstices of the substrate. The oxidation or development reaction can require several minutes for completion, or it can be extended over a period of hours, during which time the developed polypyrrole images on the substrate darkens as the polymerization reaction proceeds. The rate of the reaction or polypyrrole deposition can be increased by blowing a stream of gaseous $N_2$ over the substrate surface while the substrate is in contact with the pyrrole vapors.

After formation of the developed polypyrrole coatings or films on the substrate, if desired, the coated substrate can be rinsed, e.g., with a suitable solvent, such as methanol or isopropanol, to remove reaction by-products, or such by-products can be left within the black deposit.

The substrate coated with pyrrole polymer has an electrical conductivity which can be measured with a standard 2-probe ohmmeter apparatus, and such conductivity generally corresponds to a sheet resistivity ranging from about 10 ohms/square to about 10,000 ohms/square. The term "ohms/square" as a measure of sheet resistivity is defined as the bulk resistivity of the sample which is expressed in ohms$\times$cm divided by the thickness in cm. Sheet resistivity is proportional to the reciprocal of electrical conductivity.

Conductivity levels within the pyrrole polymer deposits can be adjusted by varying the quantity of ink or oxidant deposited on the substrate in the printing process, as well as the time of pyrrole vapor exposure. Further, to increase the conductivity of the material coated in preselected areas with pyrrole polymer, additional or repeated treatments of, for example, a fabric with an oxidant or printing solution in preselected areas of the substrate, followed by treatment with pyrrole vapors, can be carried out to build up the polymer level in the material. Hence, the conductivity of the developed polymer-coated areas of the substrate can be adjusted by the number of such treatments. Conductivity levels are also dependent on the particular oxidants, e.g., ferric salts, used and the concentration of the oxidant solution.

The following are examples of practice of the invention, it being understood that such examples are only illustrative and in no sense limitative of the invention.

EXAMPLE I

A. Preparation of Ferric Ethylbenzenesulfonate

Ferric hydroxide was prepared by slowly adding a solution of 44.1 g (1.11 mol) NaOH dissolved in 300 ml of $H_2O$ to a solution of 100 g (0.370 mol) $FeCl_3 \cdot 6 H_2O$ dissolved in 1400 ml of $H_2O$ with vigorous stirring. After one hour, the entire reaction mixture was filtered through a 2000 ml medium fritted funnel. The amorphous brown solid was rinsed with 2×500 ml portions of $H_2O$.

The ferric hydroxide prepared as described above was suspended in 700 ml methanol. To this suspension was slowly added 207 g (1.05 mol) 95% ethylbenzenesulfonic acid dissolved in 300 ml methanol. The reaction mixture was then gently warmed to 50° C. with vigorous stirring for three hours. The orange-red solution was cooled to room temperature and filtered to remove any insoluble material. The filtrate was evaporated, and the remaining oil was placed in a crystallizing dish. The reaction product was further dried in a vacuum oven (50° C., 0.15 mm). The solid residue was pulverized into a finely divided powder (250 g) and stored in a tightly sealed container.

B. Printing with Ferric Ethylbenzenesulfonate to Form Conductive Polypyrrole Deposit 1.9 g. of ferric ethylbenzenesulfonate was thoroughly mixed to a clear thick "solution" with 0.3 g. of n-butanol by mild warming (60° C.). A portion of this mixture was spread in a thin layer onto a glass slide with a knife blade, warmed at 60° C. for 10 minutes to smooth the deposit (it did not run during this treatment), and the material exposed to pyrrole vapor in a closed container for a period of 5 hours. The treated slide was then soaked in isopropanol to remove reaction by-products and air-dried. The sheet resistivity of the rough black film measured with a four-point conductivity probe was 60 ohms/square.

EXAMPLE II

Ferric dodecylbenzenesulfonate was obtained, by procedure similar to that described in Example IA, and was isolated as a sticky solid.

2.6 g. of ferric dodecylbenzenesulfonate was treated in the same manner as in Example I. The measured sheet resistivity of the smooth but brittle polypyrrole film was 220 ohms/square.

EXAMPLE III

An equal mixture of the ferric salts used in Examples I and II was dissolved in enough n-butanol at 60° C. to provide an ink in the form of a clear mixture with the proper consistency. Treating it in the manner noted in Example I, a smooth coherent film resulted with a sheet resistivity of 45 ohms/square. This combination of the ferric salts produced a superior polypyrrole deposit as compared to using the pure salts separately.

EXAMPLE IV

Referring to the drawing, the ink prepared in Example III was applied to a feed or metering roller 10 in a flexigraphic printing process, the ink level on the roller being maintained constant by scraping excess ink off the roller with a knife or scraping blade 12 associated with an ink fountain 14.

The ink on the feed roller 10 was applied to a printer roller or plate cylinder 16 having raised portions (not shown) forming a pattern, the ink being picked up on the raised portions of the printer roller.

A sheet or web of Mylar 18 was passed between the printer roller 16 and an impression cylinder 20 and into contact with the printer roller 16, and the ink on the raised portions of the roller was transferred to the Mylar sheet, forming a printed pattern on such sheet corresponding to the raised pattern on the printer roller.

The Mylar sheet containing the printed ink pattern was then exposed in a closed chamber to pyrrole vapor for a time sufficient to oxidize the printed ink pattern to a black polypyrrole deposit.

The Mylar sheet containing the developed black deposit in the preselected areas forming the pattern was passed through an isopropanol solution to remove reaction by-products and was air-dried. The sheet resistivity was approximately that obtained in Example III.

The materials containing conductive images or patterns according to the invention have application as resistive heating elements, semi-conductor components, and as electrical conductors.

From the foregoing, it is seen that the present invention provides a process wherein an electrically conductive polymer, particularly polypyrrole, can be synthesized in a printing process to form conductive patterns on a dielectric substrate by reaction of a printing ink in the form of certain oxidizing agents, with pyrrole monomer. A solution of the oxidant, e.g., $FeCl_3$, can be used as a printing ink to create precise images, and the printed surface can then be exposed preferably to pyrrole vapor to develop conductive images.

Since various changes and modifications will occur to and can be made readily by those skilled in the art without departing from the invention concept, the invention is not to be taken as limited except by the scope of the appended claims.

What is claimed is:

1. A process for generating electrically conductive patterns on a dielectric substrate which comprises:
   applying to preselected areas of the substrate a preselected concentration of an ink consisting essentially of a suitable oxidizing agent capable of reacting with a pyrrole monomer to form a printed ink surface,
   exposing the printed surface to a pyrrole monomer to form an electrically conductive polypyrrole material, and
   developing conductive images in those areas of the printed ink surface of the substrate containing the oxidizing agent.

2. The process of claim 1, said pyrrole monomer being in the form of vapors of a pyrrole.

3. The process of claim 1, said ink containing a suitable binder or thickener.

4. The process of claim 3, said binder or thickener being fine silica or a suitable organic polymer.

5. The process of claim 4, said binder or thickener being polystyrenesulfonic acid or quaternary ammonium polymer salts.

6. The process of claim 1, including the step of removing reaction by-products following said developing step.

7. The process of claim 1, said oxidizing agent being a salt of a cation selected from the group consisting of $Fe^{3+}$, $Cu^{2+}$, $Ce^{4+}$, $NO^+$, $NO_2^+$, and $(C_6H_5)_3C^+$ cations.

8. The process of claim 7, said salt having an anion selected from the group consisting of sulfate, bisulfate, sulfonate, perchlorate, chloride, fluoborate, $PF_6^-$, $AsF_6^-$, and $SbF_6^-$ anions.

9. The process of claim 1, wherein said ink is in the form of an aqueous ferric chloride solution.

10. The process of claim 1, said ink being in the form of an aqueous solution or an organic solvent solution of said oxidant including an organic solvent which is inert with respect to said oxidant.

11. The process of claim 1, wherein said ink is in the form of an aqueous ferric chloride solution containing fine silica as a thickener.

12. The process of claim 1, wherein said ink is in the form of an organic solvent solution of a ferric sulfonate selected from the group consisting of ferric ethylbenzenesulfonate and ferric dodecylbenzenesulfonate, and mixtures thereof.

13. The process of claim 1, said pyrrole monomer selected from the group consisting of pyrrole, a 3- and 3,4-alkyl and aryl C-substituted pyrrole, an N-alkylpyrrole and an N-arylpyrrole.

14. The process of claim 1, said pyrrole being a neat pyrrole.

15. The process of claim 1, said oxidant being present in the range of about 0.001 to about 2 molar.

16. The process of claim 1, said substrate being a fabric selected from the group consisting of fiberglass fabric, mixed oxide fabric and a synthetic organic fabric.

17. The process of claim 1, said substrate being selected from the group consisting of an aromatic polyamide, a polyester, a polyimide, a nylon-based material and paper.

18. A process for producing an article in the form of a dielectric substrate having preselected conductive areas or patterns thereon, by a roller printing apparatus, which comprises:

applying an ink consisting essentially of a solution of a ferric salt to a feed roller, transferring the ink on said feed roller to a printer roller having raised portions thereon corresponding to a predetermined pattern, passing a dielectric substrate into contact with said printer roller and forming a printed ink pattern on said substrate corresponding to said pattern on said printer roller, exposing the printed ink pattern on said substrate to the vapors of a pyrrole monomer, and oxidizing said pyrrole monomer as it contacts the ferric salt in the printed ink pattern, to develop conductive polypyrrole images in the printed areas on the substrate.

19. The process of claim 18, wherein said ink is in the form of an aqueous ferric chloride solution.

20. The process of claim 18, wherein said ink is in the form of an organic solvent solution of a ferric sulfonate selected from the group consisting of ferric ethylbenzenesulfonate and ferric dodecylbenzenesulfonate, and mixtures thereof.

21. The process of claim 20, said solvent being selected from the group consisting of alcohols, nitriles, ketones and ethers.

22. The process of claim 18, wherein said ink includes a suitable binder or thickener in the form of fine silica in a suitable organic binder.

23. The process of claim 18, said substrate being selected from the group consisting of fiberglass, an aromatic polyamide, a polyester, a polyimide, a nylon-based material and paper.

24. The process of claim 18, including the step of smoothing the ink on said printer roller by heating.

25. The process of claim 18, including rinsing said substrate with a solvent, following the development of said conductive polypyrrole images, to remove reaction by-products.

* * * * *